(12) United States Patent
Terry (10) Patent No.: US 7,434,128 B2
(45) Date of Patent: Oct. 7, 2008

(54) SYSTEMS AND METHODS FOR IDENTIFYING SYSTEM LINKS

(75) Inventor: Steven Wayne Terry, Irving, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 763 days.

(21) Appl. No.: 11/088,648

(22) Filed: Mar. 24, 2005

(65) Prior Publication Data

US 2006/0215573 A1 Sep. 28, 2006

(51) Int. Cl.
*G01R 31/28* (2006.01)
*G06F 7/02* (2006.01)
*H03M 13/00* (2006.01)

(52) U.S. Cl. .................. 714/727; 714/819; 714/820

(58) Field of Classification Search ................ None
See application file for complete search history.

(56) References Cited

U.S. PATENT DOCUMENTS 5,271,010 A * 12/1993 Miyake et al. .............. 370/392
5,627,842 A * 5/1997 Brown et al. ................ 714/727
7,024,591 B2 * 4/2006 Moody et al. ................ 714/43

\* cited by examiner

*Primary Examiner*—Christine T Tu (57) ABSTRACT

In one embodiment, a method for identifying links in a system under evaluation includes assigning unique identifiers to drivers of the system, emitting the identifiers from the drivers on associated links, collecting data received by receivers of the system, and comparing the driver identifiers with the data received by the receivers to determine which drivers are linked to which receivers.

29 Claims, 6 Drawing Sheets

SYSTEMS AND METHODS FOR IDENTIFYING SYSTEM LINKS

BACKGROUND

High-speed links are common in high-end computing systems. Such links generally comprise an interface between system devices that facilitates high-speed communication. For example, a high-speed link may be an interface between two integrated circuit (IC) chips that are provided on a circuit board of a computing system.

It is desirable to design system links to transmit information as quickly as possible so as to avoid communication bottlenecks. Given that problems can occur with such links, particularly when great communication speeds are attempted, it is often necessary to test the links to verify that they are working correctly. Problems with a link may result in data corruption or decreased performance.

Before such testing can be performed, the configuration of various links of the system must be identified. In other words, a given link cannot be tested until the link is located. Although identifying links that exist between components on a single part, such as a circuit board, is relatively straightforward, it can be more difficult to identify links that exist between a component on a first part and another component on a second part. For example, a link may extend from a chip on a processor circuit board and a chip on a separate input/output (I/O) circuit board. Without some automated means for identifying that link, it may be difficult or even impossible for the user to locate the link so that testing of the link can be performed.

Automated identification of system links is sometimes provided by computing systems. For example, some operating systems are configured to analyze the state of the computing system upon start up to locate such links. Although such solution can be satisfactory, it may not be available in cases in which the system is not yet completed. Moreover, such a solution may not be viable in cases in which manufacturing defects are present that prevent such analysis from being performed.

SUMMARY

Disclosed are systems and method for identifying system links. In one embodiment, a method for identifying links in a system under evaluation includes assigning unique identifiers to drivers of the system, emitting the identifiers from the drivers on associated links, collecting data received by receivers of the system, and comparing the driver identifiers with the data received by the receivers to determine which drivers are linked to which receivers.

BRIEF DESCRIPTION OF THE DRAWINGS

The systems and methods of this disclosure can be better understood with reference to the following drawings. The components in the drawings are not necessarily to scale.

DETAILED DESCRIPTION

As is described in the following, the links of system can be identified, even prior to system completion, using a link identification system that leverages boundary scan technology. In operation, the link identification system loads drivers of a system under evaluation with unique data, and then controls the drivers to drive the data on their associated links, if any. The link identification system then collects the data received by the system receivers. Through comparison of the data that was driven by the drivers and the data that was received by the receivers, the system links can be identified. Once those links are identified, they can be tested, if desired, to confirm that they are operating correctly.

Figure 1:
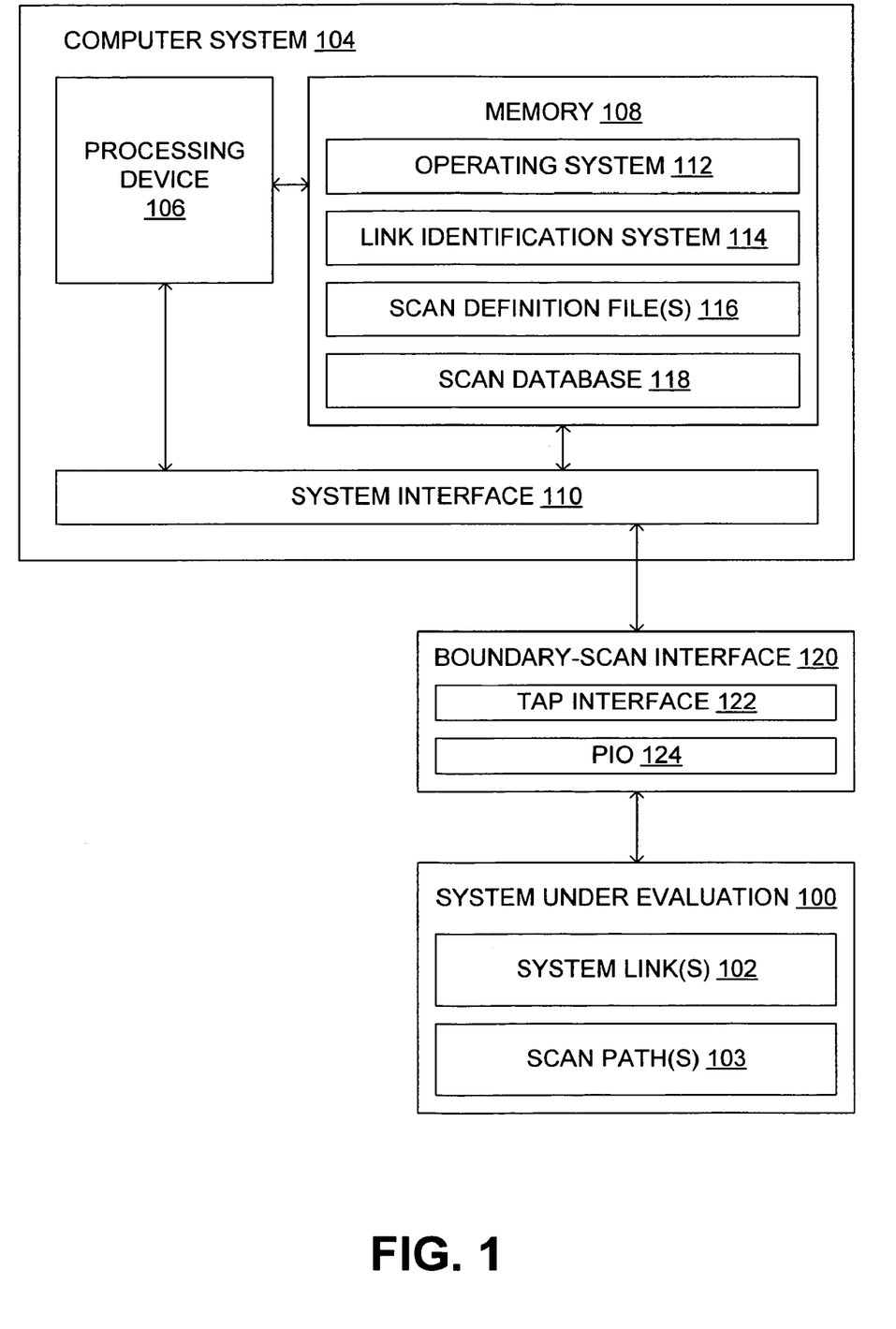
FIG. 1 is a schematic view of an embodiment of apparatus used to evaluate a system.

Referring now to the figures, in which like numerals identify corresponding parts, FIG. 1 illustrates apparatus that can be used to identify system links 102 of a system under evaluation 100. By way of example, the system under evaluation 100 comprises one or more circuit boards that each includes one or more electrical components (e.g., chips) that are linked together. As is described in greater detail below, such links may extend between components that are provided on separate circuit boards.

In the example embodiment of FIG. 1, the apparatus comprises a computer system 104. This computer system 104 can comprise a common computer, such as a server computer, a desktop computer (e.g., IBM- or Macintosh-compatible), or a laptop computer. The computer system 104 includes a processing device 106 that comprises, for instance, a custom-made or commercially-available processor, a central processing unit (CPU), or a semiconductor-based microprocessor.

Also included in the computer system 104 is memory 108 that can include one or more volatile memory elements (e.g., read access memory (RAM)) and one or more nonvolatile memory elements (e.g., flash memory, magnetic RAM (MRAM), etc.).

The computer system 104 further comprises a system interface 110 that includes one or more components that enable the computer system to communicate with other systems or devices, such as a boundary-scan interface 120. The boundary-scan interface 120 may be part of the computer system 104, the system under evaluation 100, or a separate device. The components of the boundary-scan interface 120 may comprise, for example, a Personal Computer Memory Card International Association (PCMCIA) card. When provided, the boundary-scan interface 120 acts as an intermediary between the computer system 104 and the system under evaluation 100, and provides a means for facilitating control of scan paths 103 of the system under evaluation. As is illustrated in FIG. 1, the boundary-scan interface 120 can include, for example, a test access port (TAP) interface 122 and a programmed input/output (PIO) 124.

The memory 108 comprises various programs, for example in software, including an operating system 112 and a link identification system 114. The operating system 112 controls the execution of other programs and provides scheduling, input-output control, file and data management, memory management, and communication control and related services. The link identification system 114 is configured to automatically identify links 102 comprised by the system under evaluation 100. In some embodiments, the link identification system 114 loads rings of a boundary-scan architecture that is integrated into the devices of the system under evaluation 100 using methodologies described in the Institute of Electrical and Electronics Engineers (IEEE) 1149.1 standard, commonly referred to as JTAG. As is described in greater detail below, scanning information into those rings via the boundary-scan architecture enables the link identification system 114 to control boundary-scan elements that facilitate link identification.

Also contained in memory 108 are one or more scan definition files 116 and a scan database 118. The scan definition files 116 describe the configuration of the system devices and, optionally, the manner in which link tests can be initialized for links associated with the devices. The information contained in the scan definition files 116, and the location of the links obtained through the link identification process described herein can, in turn, be used to complete the scan database 118, which defines the relationships between the devices, and their associated links and scan paths.

It is noted that the programs (i.e., logic) described above can be stored on any computer-readable medium for use by or in connection with any computer-related system or method. In the context of this document, a computer-readable medium is an electronic, magnetic, optical, or other physical device or means that can contain or store a computer program for use by or in connection with a computer-related system or method. The programs can be embodied in any computer-readable medium for use by or in connection with an instruction execution system, apparatus, or device, such as a computer-based system, processor-containing system, or other system that can fetch the instructions from the instruction execution system, apparatus, or device and execute the instructions.

Figure 2:
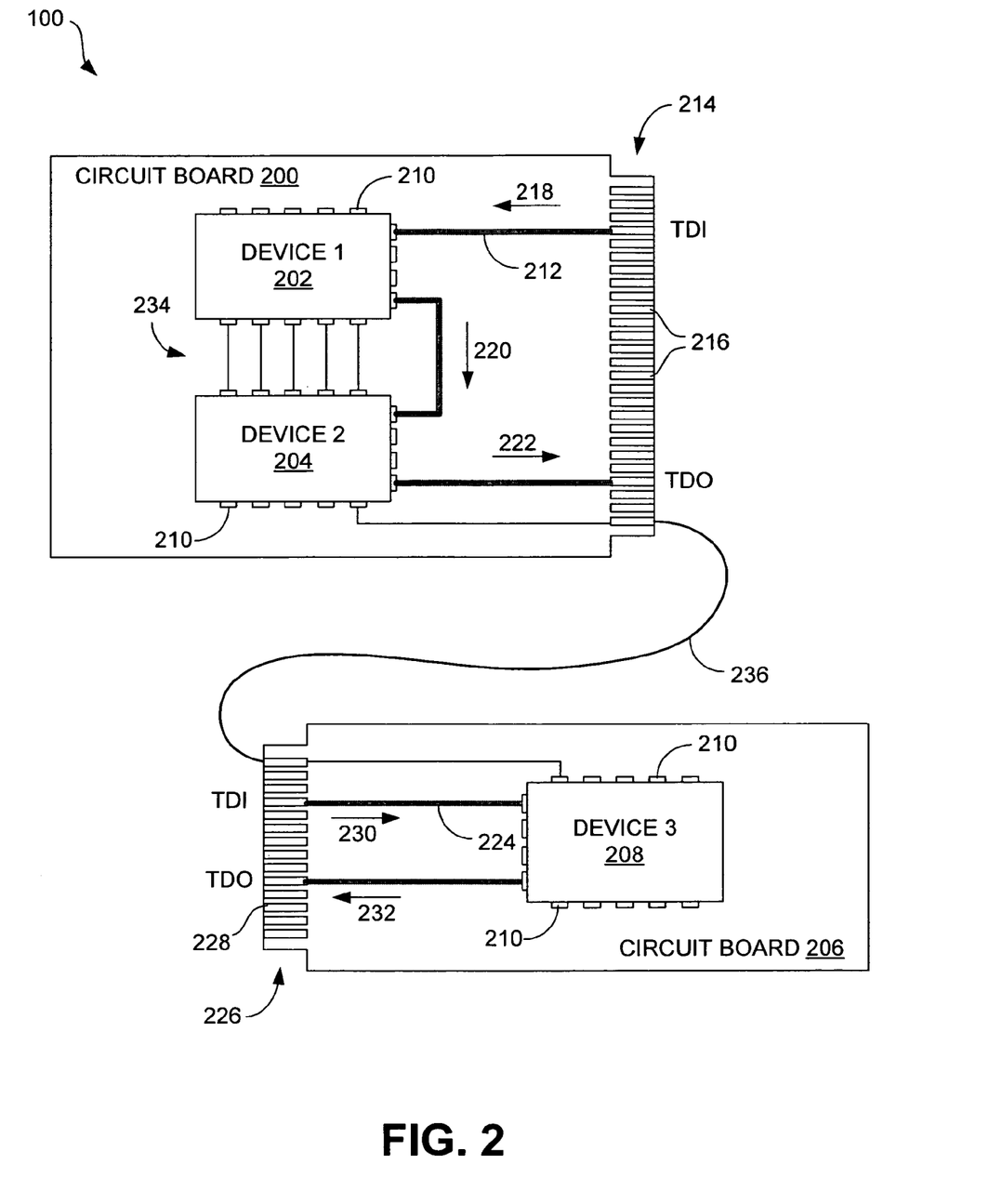
FIG. 2 is a schematic view of an example embodiment for a system under evaluation shown in FIG. 1.

FIG. 2 provides an example embodiment for the system under evaluation 100 of FIG. 1. As is indicated in FIG. 2, the system under evaluation 100 in the illustrated embodiment comprises a first circuit board 200 that includes two devices, device 1 (202) and device 2 (204), and a second circuit board 206 that includes one device, device 3 (208). By way of example, the first circuit board 200 comprises a processing circuit board that provides processing services to the system 100, and the second circuit board 206 comprises an I/O card that provides another service to the system (e.g., network connection, connection of storage devices, etc.).

Each device 202, 204, and 208 is a boundary-scan device, meaning that each device is equipped with integral boundary-scan architecture that enables boundary-scan testing in accordance with IEEE 1149.1 to be conducted. In the example of FIG. 2, each device 202, 204, and 208 comprises an integrated circuit (IC) chip having a plurality of input/output (I/O) pins 210.

Information can be scanned into the devices 202, 204, and 208 using one or more scan paths. As is shown in FIG. 2, one scan path 212 extends to and from an edge connector 214 of the circuit board 200 that comprises a plurality of contacts 216. With this arrangement, a test data in (TDI) signal can be input into the first device 202 (arrow 218), output to the second device 204 (arrow 220), and then output from the circuit board (arrow 222) as a test data out (TDO) signal. In similar manner, another scan path 224 extends to and from an edge connector 226 of the circuit board 206 that comprises a plurality of contacts 228. With this arrangement, a TDI signal can be input into the third device 208 (arrow 230) and then output from the circuit board (arrow 232) as a TDO signal.

As is also shown in FIG. 2, the system under evaluation 100 comprises a plurality of links. In the embodiment of FIG. 2, these links include links 234 that extend between the devices 202 and 204, and a link 236 that extends from the device 204 to the device 208. The link 236 may comprise, for example, a cable that connects the circuit board 200 to the circuit board 206. Although it may be relatively straightforward to identify the links 234 because they exist between devices contained on a single circuit board, it may be difficult to identify the link 236. In particular, because the cable that is used to form the link could be connected to a variety of different circuit boards, it may be difficult to determine to which circuit board, and which device on that circuit board, the link extends. For example, if a given system comprises four processing circuit boards and four I/O cards, many different connection arrangements are possible, and therefore, many different links may exist.

Figure 3:
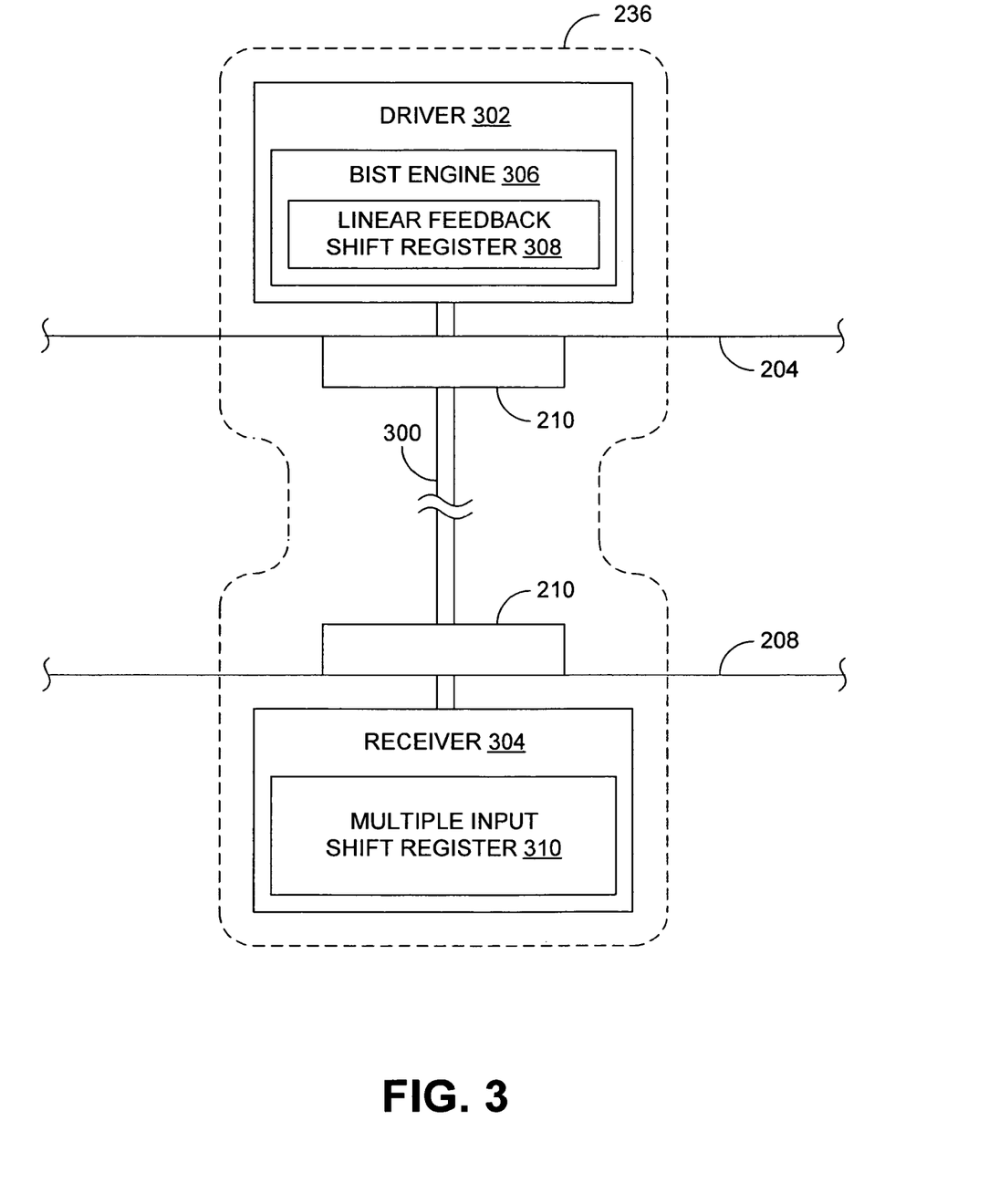
FIG. 3 is a schematic view of an example embodiment of a link of the system under evaluation shown in FIG. 2.

FIG. 3 illustrates an example embodiment for the link 236 of the system under evaluation 100 shown in FIG. 2. As is indicated in FIG. 3, the link 236 extends from the device 204 of the first circuit board 200 to the device 208 the second circuit board 206. The link 236 includes a communication pathway 300 that extends between a pin 210 of the device 204 to a pin 210 of the device 208. This communication pathway 300 can comprise any medium along which messages can be transmitted between the devices 204, 208, and may include a cable.

As used herein, the term "link" includes the logic provided at both ends of the communication pathway 300 to enable communication between the devices 204, 208. In the link embodiment of FIG. 3, this logic comprises a driver 302 that is provided at a first end of the link 236 (in device 204), and a receiver 304 that is provided at a second end of the link (in device 208). The driver 302 may include a built-in self test (BIST) engine 306 that comprises a linear feedback shift register (LFSR) 308, and the receiver 304 may include a multiple input shift register (MISR) 310. When provided, those components can facilitate testing of the link 236, as is described below.

Figure 4:
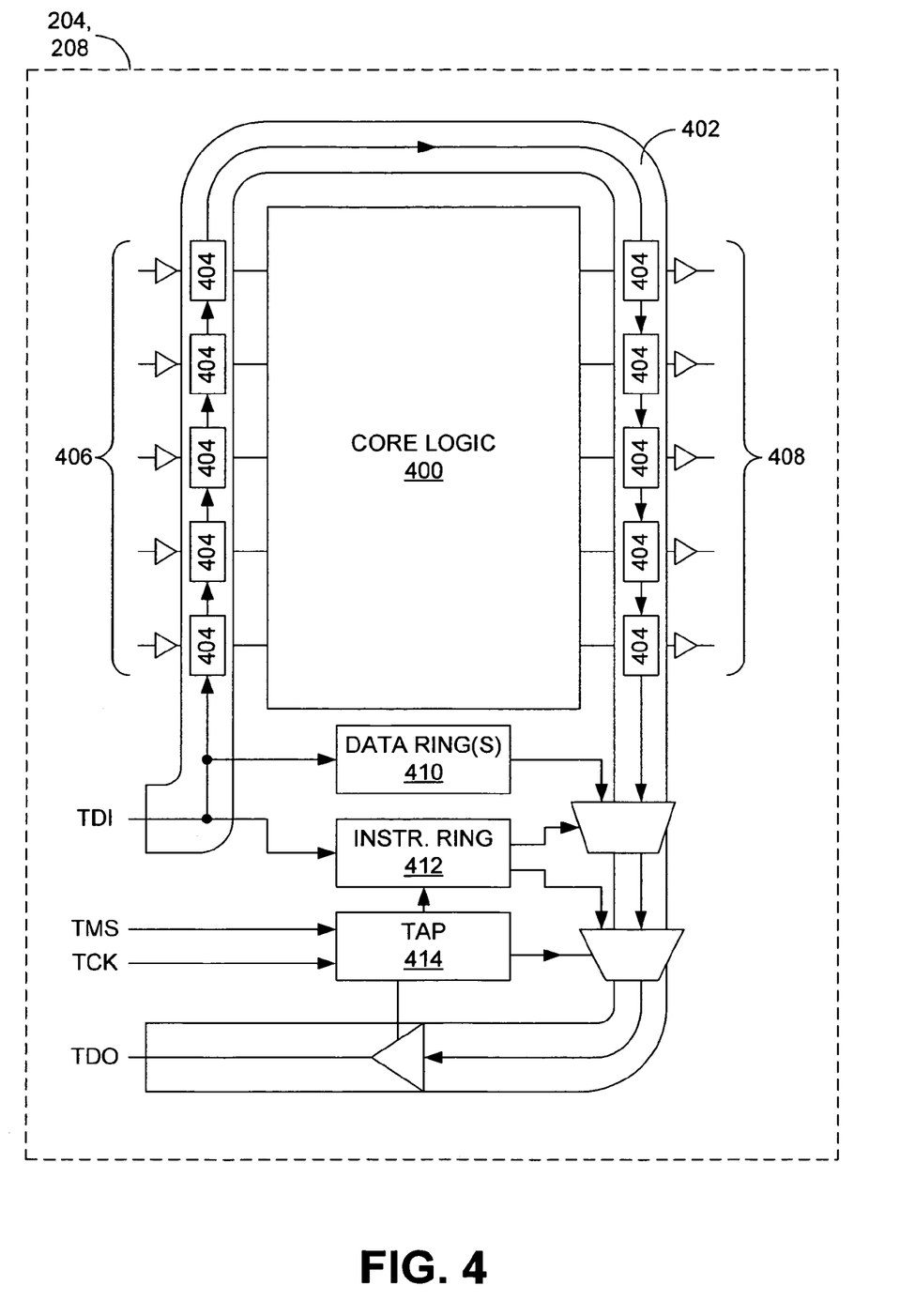
FIG. 4 is a block diagram of an embodiment of architecture of a device of the system under evaluation shown in FIG. 2.

FIG. 4 provides an example embodiment of the architecture for at least one of the devices 204 and 208 shown in FIG. 2. More specifically, illustrated is boundary-scan architecture of the device 202, 204. As is shown in FIG. 4, the device 204, 208 includes core logic 400 that comprises the core functionality of the device. Surrounding the core logic 400 is a scan ring 402 that comprises a plurality of scan cells 404. One such cell 404 is provided for each of a plurality of input pins 406 of the device 204, 208, and for each of a plurality of output pins 408 of the device.

Also depicted in FIG. 4 are a data ring 410 and an instruction ring 412. Those rings may be used to provide information to the BIST engine 306 (FIG. 3) to conduct link tests. During such a test, test data can be scanned into these rings 410, 412 as input signals (TDI) transmitted along the scan path. In addition, the device 202, 204 includes a test access port (TAP) 414 that receives boundary-scan control signals for the purpose of conducting boundary scanning in accordance with IEEE 1149.1. Those control signals can be input as test mode signal (TMS) and test clock (TCK) signals.

As is described in greater detail below, data can be input into the scan cells 404 of the boundary ring 402 to facilitate link identification. More particularly, each scan cell associated with each pin can be loaded with a unique identifier that can be driven out along a link associated with the driver at that pin, assuming such a link exists.

Example systems having been described above, example methods for identifying links will now be described. In the discussions that follow, flow diagrams are provided. Any process steps or blocks in these flow diagrams may represent modules, segments, or portions of code that include one or more executable instructions for implementing specific logical functions or steps in the process. Although particular example process steps are described, alternative implementations are feasible. For instance, some steps may be executed out of order from that shown and discussed depending on the functionality involved.

As is described above, the link identification system 114 can be used to control the system drivers and receivers to perform link identification. More particularly, the link identification system 114 leverages the boundary-scan architecture and scan paths of the system under evaluation to load the scan cells (i.e., registers) associated with the system drivers with data that uniquely identifies each driver. That process equates to assigning a unique identifier to each driver that the drivers can emit onto their pins to drive the identifiers out onto their associated links. Once those identifiers have been so driven, the link identification system 114 can control the receivers of the system to sample the data received on their pins, and can scan this data out from the receivers. Through comparison of the identifiers that have been assigned to the drivers and the identifiers that have been sampled by the receivers, the link identification system 114 can determine which drivers are linked to which receivers and, therefore, can identify the links of the system. That information can then be used to generate a link model, which can be used to conduct testing of the identified links, if desired. Given that such identification is conducted using the boundary-scan architecture of the system devices, link identification can be achieved before the system under evaluation is completed and, potentially, even if manufacturing defects exist that would prevent other forms of link identification from being successfully performed.

The complexity of identifying or finding where links exist in a system is related to the complexity of the system. Some systems may have devices that can drive and receive multiple links, and some links may involve cables that can be configured in different ways. In order for the link identification system 114 to develop the correct bit streams to provide on the scan path to correctly load the registers, the scan implementation of the system under evaluation must be considered a whole. In other words, a system-level scan approach is necessary.

A system-level understanding of the system under evaluation can be obtained using information about the various devices that comprise the system. Such information can be obtained from the scan definition files (e.g., files 116, FIG. 1) that define the system devices.

Figure 5:
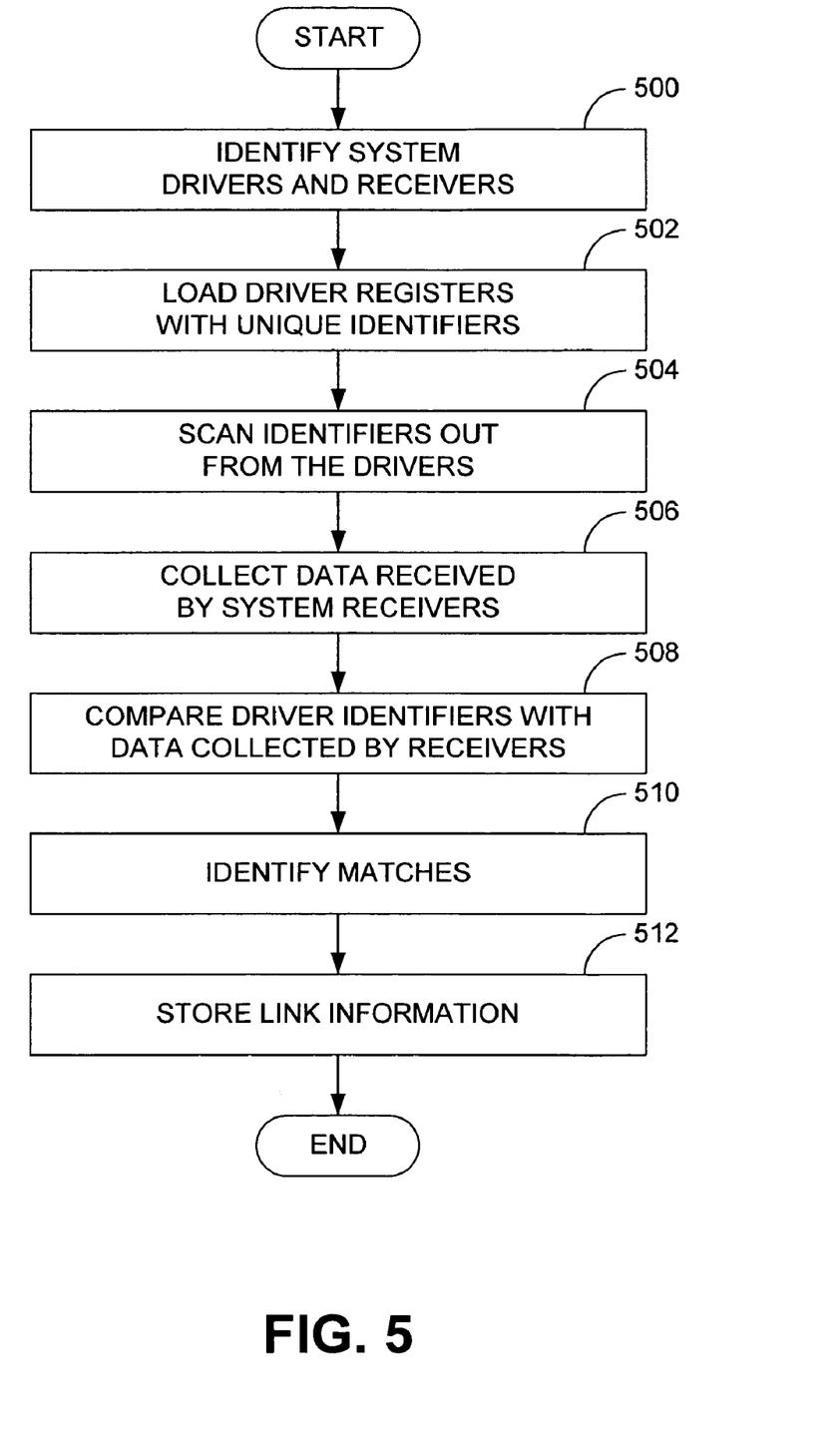
FIG. 5 is a flow diagram of an embodiment of a method for identifying system links.

FIG. 5 describes an embodiment of a method for identifying system links. Beginning with block 500, the link identification system 114 first identifies the drivers and receivers of the system under evaluation. This information can be determined with reference to the scan definition files described in the foregoing. Those files describe the configuration of the system devices and, therefore, identify the drivers and receivers of the system. In keeping with the example of FIGS. 2 and 3, the scan definition files may identify, among others, the driver 302 and the receiver 304.

Once the drivers and receivers have been identified, or at least after the drivers have been identified, the link identification system 114 loads the driver registers with unique identifiers, as indicated in block 502. Specifically, the system 114 loads the scan cells (e.g., cells 404, FIG. 4) associated with each driver. As is described above in relation to FIG. 4, the scan cells comprise part of the boundary-scan rings of the system devices. Notably, the registers of only a limited number of drivers may be loaded. For example, the drivers that form part of known links (e.g., links that are wholly contained on a given circuit board) may be exempted from the identification process.

The unique identifiers need only distinguish each driver from the others. For example, if four drivers are to be provided with identifiers, the first could be given a value of "1," the second driver could be given a value of "2," and so forth. In cases in which the length of the register is greater than the number of bits required to describe the unique identifier, the identifier can be repeated multiple times. For instance, if the registers associated with the drivers are 16-bit registers, but only four bits are required to describe the driver's unique identifier, the identifier can be repeated four times. Such a practice increases the likelihood of the identifier being received by a receiver in cases in which the link between the driver and the receiver is corrupted.

In order to load the registers, the link identification system 114 identifies the scan paths that are associated with the devices that comprise the drivers. That identification can be made with reference to an appropriate resource, such as the scan database 118 of FIG. 1, that describes the relationships between the system devices and scan paths. With that information, the unique identifier data can be scanned along the scan paths to load the data into the appropriate registers.

Referring next to block 504, the link identification system 114 scans the identifiers out from the drivers. More particularly, the system 114 controls the system under evaluation to force the loaded register values out onto the pins associated with the drivers to thereby drive the values out onto the associated links, if any. By way of example, this can be accomplished using an "extest" mode specified by IEEE 1149.1.

After the identifiers have been driven onto the links, the data received by the system receivers that were identified in block 500 is collected, as indicated in block 506. Specifically, the boundary-scan architecture of the system under evaluation is leveraged to capture the values that are received by each receiver. Once those values are collected, the link identification system 114 compares the driver identifiers with the data collected by the receivers, as indicated in block 508. Assuming that the links are not corrupted, broken, or missing, each identifier driven over a link will have been received by a single receiver. Accordingly, the system 114 can identify matches for the drivers and receivers, as indicated in block 510 to thereby identify the drivers and receivers that are linked together and, therefore, define a given system link.

Figure 6:
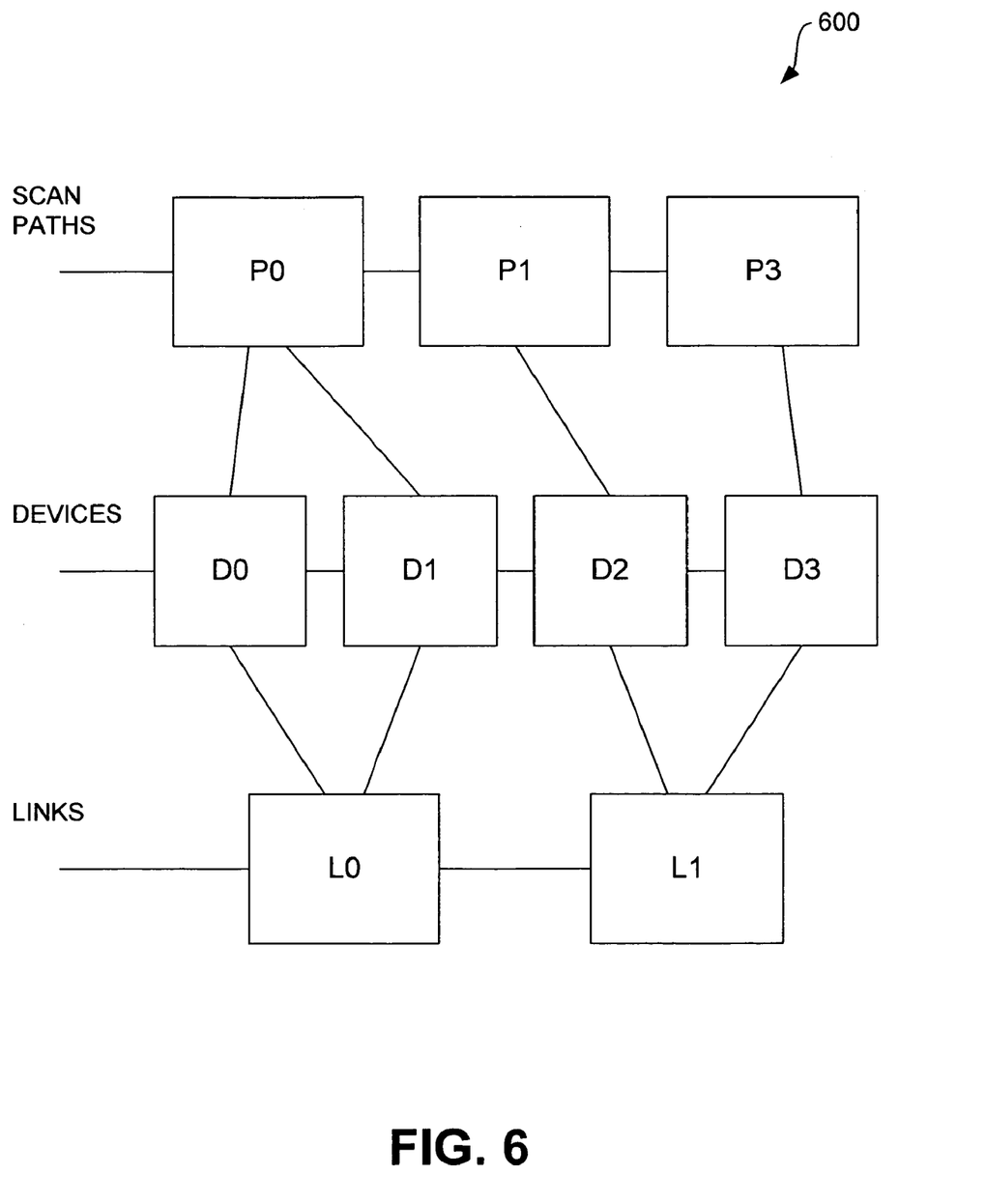
FIG. 6 is a graphical depiction of an example link model.

Once the system links have been identified in the manner described above, the link identification system 114 can store the link information, as indicated in block 512. This storing can comprise, for example, including the link information in the scan database (e.g., database 118, FIG. 1) to form a link model for the system under evaluation. FIG. 6 provides a graphical depiction of one such link model 600. As is indicated in FIG. 6, the link model 600 includes four devices (D0-D3) on three scan paths (P0-P3), with two links (L0 and L1) each connecting two devices.

With the link information, link testing can be conducted to determine whether the system links are operating properly. By way of example, such link testing can comprise the form of testing described in a co-owned patent application entitled "Systems and Methods for Testing System Links", filed Mar. 30, 2005, and having Ser. No. 11/094,737, which is hereby incorporated by reference into the present disclosure.

What is claimed is:

1. A method for identifying links in a system under evaluation, the method comprising:
   assigning unique identifiers to drivers of at least one device of the system;
   emitting the identifiers from the drivers on associated links;

collecting data received by receivers of at least one device of the system; and comparing the driver identifiers with the data received by the receivers to determine which drivers are linked to which receivers.

2. The method of claim 1, wherein assigning unique identifiers comprises loading registers associated with the drivers with unique identifier values.

3. The method of claim 2, wherein loading registers comprises loading the registers such that the unique identifiers are repeated.

4. The method of claim 2, wherein loading registers comprises loading registers of scan cells provided within a boundary-scan ring of at least one device.

5. The method of claim 1, wherein emitting the identifiers comprises driving the identifiers on to pins associated with the drivers to drive the identifiers out on to the associated links.

6. The method of claim 5, wherein driving the identifiers comprises driving the identifiers using an extest mode specified by IEEE 1149.1.

7. The method of claim 1, wherein collecting data comprises capturing values received by the receivers using a boundary-scan architecture of at least one device.

8. The method of claim 1, further comprising identifying drivers and receivers of the system under evaluation.

9. The method of claim 8, wherein identifying drivers and receivers comprises consulting at least one scan definition file that describes the configuration of a system device.

10. The method of claim 1, further comprising storing link information.

11. The method of claim 10, wherein storing link information comprises storing a link model within a scan database for the system under evaluation.

12. A link identification system, the system comprising:
means for assigning unique identifiers to drivers of a system under evaluation;
means for controlling the drivers to emit the identifiers on associated links;
means for collecting data received by receivers of the system under evaluation; and
means for comparing the driver identifiers with the data received by the receivers.

13. The system of claim 12, wherein the means for assigning unique identifiers comprise means for loading registers of scan cells provided within a boundary-scan ring of at least one device of the system under evaluation.

14. The system of claim 12, wherein the means for controlling the drivers comprise means for controlling the drivers by leveraging boundary-scan architecture of the system under evaluation.

15. The system of claim 12, wherein the means for collecting data comprise means for capturing values received by the receivers by leveraging boundary-scan architecture of the system under evaluation.

16. The system of claim 12, further comprising means for identifying drivers and receivers of the system under evaluation.

17. The system of claim 12, further comprising means for storing link information.

18. A link identification system stored on a computer-readable medium, the system comprising:
logic configured to provide unique identifiers to drivers of a system under evaluation;
logic configured to control the drivers to drive the unique identifiers on to associated links;
logic configured to collect data received by receivers of the system under evaluation; and
logic configured to compare the driver identifiers with the data received by the receivers.

19. The system of claim 18, wherein the logic configured to provide unique identifiers comprises logic configured to load registers of a boundary-scan ring of a device of the system under evaluation.

20. The system of claim 18, wherein the logic configured to control comprises logic configured to control the drivers using boundary-scan architecture of the system under evaluation.

21. The system of claim 18, wherein the logic configured to collect data comprises logic configured to capture values received by the receivers using boundary-scan architecture of the system under evaluation.

22. The system of claim 18, further comprising logic configured to identify drivers and receivers of the system under evaluation.

23. The system of claim 18, further comprising logic configured to store link information.

24. A computer system, comprising:
a processing device; and
memory that includes a link identification system, the link identification system being configured to assigning unique identifiers to drivers of the system under evaluation, to control the drivers to drive the identifiers out on associated links, to collect data received by receivers of the system under evaluation, and to compare the driver identifiers with the data received by the receivers to determine which drivers are linked to which receivers.

25. The computer system of claim 24, wherein the link identification system is configured to load registers of a boundary-scan ring that are associated with the drivers.

26. The computer system of claim 24, wherein the link identification system is configured to drive the identifiers using an extest mode specified by IEEE 1149.1.

27. The system of claim 24, wherein the link identification system is configured to capture values received by the receivers using boundary-scan architecture of the system under evaluation.

28. The system of claim 24, wherein the link identification system is further configured to identify drivers and receivers of the system under evaluation.

29. The system of claim 24, wherein the link identification system is further configured to store link information.

* * * * *